United States Patent
Gibson et al.

(10) Patent No.: US 8,395,058 B2
(45) Date of Patent: Mar. 12, 2013

(54) METAL CORE CIRCUIT BOARD WITH CONDUCTIVE PINS

(75) Inventors: Ronald S. Gibson, Valencia, CA (US); Deepanjan Mitra, Irvine, CA (US); Ammar Burayez, Silverado, CA (US)

(73) Assignee: SureFire, LLC, Fountain Valley, CA (US)

( * ) Notice: Subject to any disclaimer, the term of this patent is extended or adjusted under 35 U.S.C. 154(b) by 328 days.

(21) Appl. No.: 12/766,655

(22) Filed: Apr. 23, 2010

(65) Prior Publication Data

US 2011/0261557 A1    Oct. 27, 2011

(51) Int. Cl.
 *H05K 1/11* (2006.01)
(52) U.S. Cl. .......................................... 174/267; 29/837
(58) Field of Classification Search .......... 174/262–267; 29/837–845; 361/772–776
See application file for complete search history.

(56) References Cited

U.S. PATENT DOCUMENTS

| | | | |
|---|---|---|---|
| 6,229,101 B1 * | 5/2001 | Sekiya et al. | 174/266 |
| 6,262,477 B1 | 7/2001 | Mahulikar et al. | |
| 6,903,271 B2 | 6/2005 | Pearson et al. | |
| 7,116,061 B2 | 10/2006 | Kim et al. | |
| 2005/0023034 A1 * | 2/2005 | Ishida et al. | 174/264 |
| 2009/0001558 A1 | 1/2009 | Shiau | |
| 2010/0187004 A1 * | 7/2010 | Kawade et al. | 174/267 |

FOREIGN PATENT DOCUMENTS

| | | | |
|---|---|---|---|
| DE | 10 2008 056923 A1 | 5/2010 | |
| WO | WO 2010/054924 A1 | 5/2010 | |

* cited by examiner

*Primary Examiner* — Jeremy Norris
(74) *Attorney, Agent, or Firm* — Haynes and Boone, LLP

(57) ABSTRACT

A metal core circuit board assembly includes a circuit board having a through hole in an embodiment. A shaft for a pin is inserted in the through hole such that cap of the pin abuts a foil layer on the circuit board. The shaft diameter is sufficiently smaller than the through hole diameter such that the shaft is electrically isolated from a metal core for the circuit board. The cap is undercut about the through hole to further isolate the pin from the non-electrically isolated portion of the metal core circuit board.

20 Claims, 4 Drawing Sheets

METAL CORE CIRCUIT BOARD WITH CONDUCTIVE PINS

TECHNICAL FIELD

This application relates to circuit boards and, more particularly, to a metal core circuit board modified with conductive pins.

BACKGROUND

Light emitting diodes (LEDs) are rapidly replacing conventional sources of illumination such as incandescent bulbs. Because an LED is typically a discrete circuit, it is common to mount LEDs on circuit boards so that the LED may receive the appropriate circuit leads. Although LEDs are more efficient than conventional illumination sources, they still emit an appreciable amount of heat during operation. Metal core printed circuit boards are thus used to provide thermal management for mounted LEDs. Such a board would include a conductive core such as aluminum that is coated with a one or more dielectric layers. A printed or lithographed foil layer, such as copper, overlays the dielectric layer. The foil layer forms the electrical leads to couple to the LED. The dielectric layer(s) act to insulate the foil layer and the coupled circuits from the conductive core. Although the core is thus electrically isolated, it is still thermally connected to the LED such that it acts as an adequate heat sink.

But conventional metal core board technology is problematic for applications that must pass electrical leads through the board. For example, such a need is present in LED flashlight applications. In that regard, consider the construction of a conventional flashlight—there is an elongated cylindrical battery housing that holds the batteries and allows a user to handle the device. The battery housing connects to a flashlight head that includes a lens or transparent cover held by a bezel. At the base of the bezel is the circuit board holding the LED(s).

The circuit board is mounted within the flashlight orthogonally to the optical axis of the lens. However, such a circuit board arrangement then forms a natural barrier to the necessary electrical leads for coupling between the batteries and the board's printed foil layer (and ultimately to the LED). Conductive pins passing through the circuit board to couple to the printed foil layer need insulation from the metal core in the board to prevent the batteries from shorting out through the resulting conduction in the metal core. But an insulated pin then requires an extra soldering step to couple to the printed foil layer, which increases manufacturing costs. Alternatively, wires can be passed through a gap between the edge of the board and the bezel, which still requires an extra soldering step and requires a bigger installation space.

Accordingly, there is a need in the art for metal core circuit board configurations that enable efficient construction and soldering of leads such as conductive pins to pass through the board.

SUMMARY

In accordance with a first embodiment of the invention, a circuit board assembly is provided that includes: a metal core circuit board having a principal surface for mounted circuits and at least one through hole extending between the principal surface and a backside surface for the metal core circuit board; and an at least one conductive pin, wherein each conductive pin includes a shaft extending through a corresponding through hole and a pin cap abutting the principal surface adjacent the corresponding through hole such that an undercutting for the pin cap circumferentially surrounds the corresponding through hole.

In accordance with a second embodiment of the invention, a method of manufacturing a circuit board assembly is provided that includes: providing a circuit board having a through hole at least partially surrounded by solder; inserting a shaft for a conductive pin into the through hole such that a cap for the conductive pin abuts the solder wherein the through hole has a diameter sufficiently exceeding a diameter for shaft such that the shaft is electrically isolated from a metal core for the circuit board, and wherein the cap has an inner undercut portion surrounding the through hole and an outer remaining portion abutting the solder; and heating the solder such that it reflows and electrically couples the pin to a metal foil layer on the circuit board.

In accordance with a third embodiment of the invention, a flashlight is provided that includes a flashlight head including a lens held by a bezel; a metal core circuit board secured to the bezel, the circuit board including a light emitting diode (LED) for illumination through the lens; and a battery housing for holding batteries for powering the LED through a conductive path that includes a first conductive pin having a shaft extending through a first through hole in the circuit board, the first conductive pin including a pin cap abutting a principal surface of the circuit board adjacent the first through hole such that an undercutting for the pin cap circumferentially surrounds the first through hole.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE FIGURES

Embodiments of the present invention and their advantages are best understood by referring to the detailed description that follows. It should be appreciated that like reference numerals are used to identify like elements illustrated in one or more of the figures.

DETAILED DESCRIPTION

Figure 1:
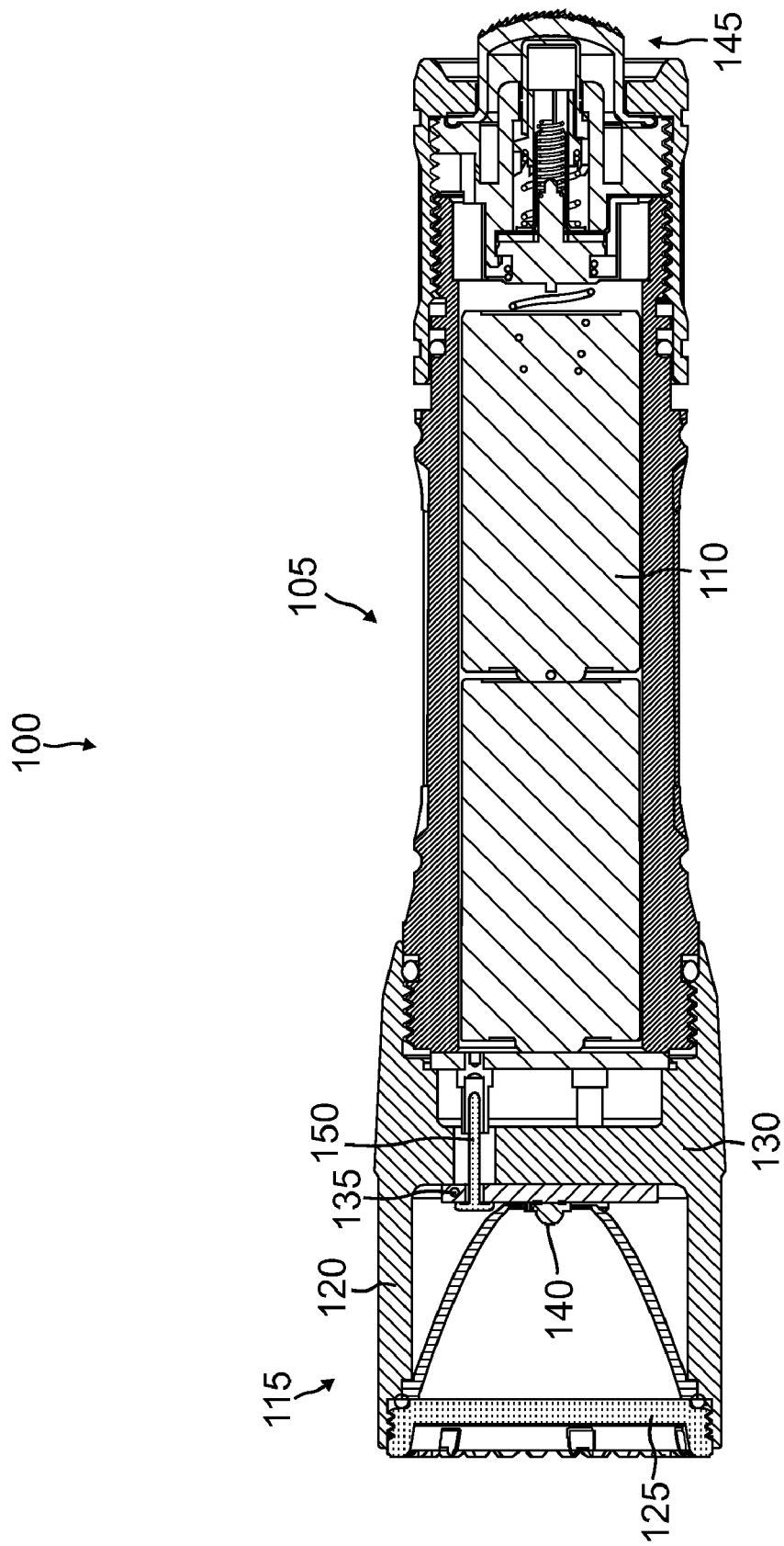
FIG. 1 is a longitudinal cross sectional view of a flashlight including a metal core board transversed by undercut conductive pins in accordance with an embodiment of the invention.

The following metal core circuit board configuration will be discussed with regard to an example flashlight embodiment. However, it will be appreciated that such a configuration can be widely applied to other applications besides flashlights where there is a need to pass conductors through the metal core circuit board to electrically couple to the printed foil layer. Turning now to the drawings, FIG. 1 shows a longitudinal cross section of a flashlight 100 including a battery housing 105 holding batteries 110.

A flashlight head 115 includes a bezel 120 holding a lens 125 and forming a backing plate 130. A metal core circuit board 135 mounts to backing plate 130 so that heat from an LED 140 may dissipate as discussed previously. To turn the flashlight on and off, a user activates a switch 145. With the switch on, current from the batteries flows through one or more conductive pins 150 to the LED.

Figure 2:
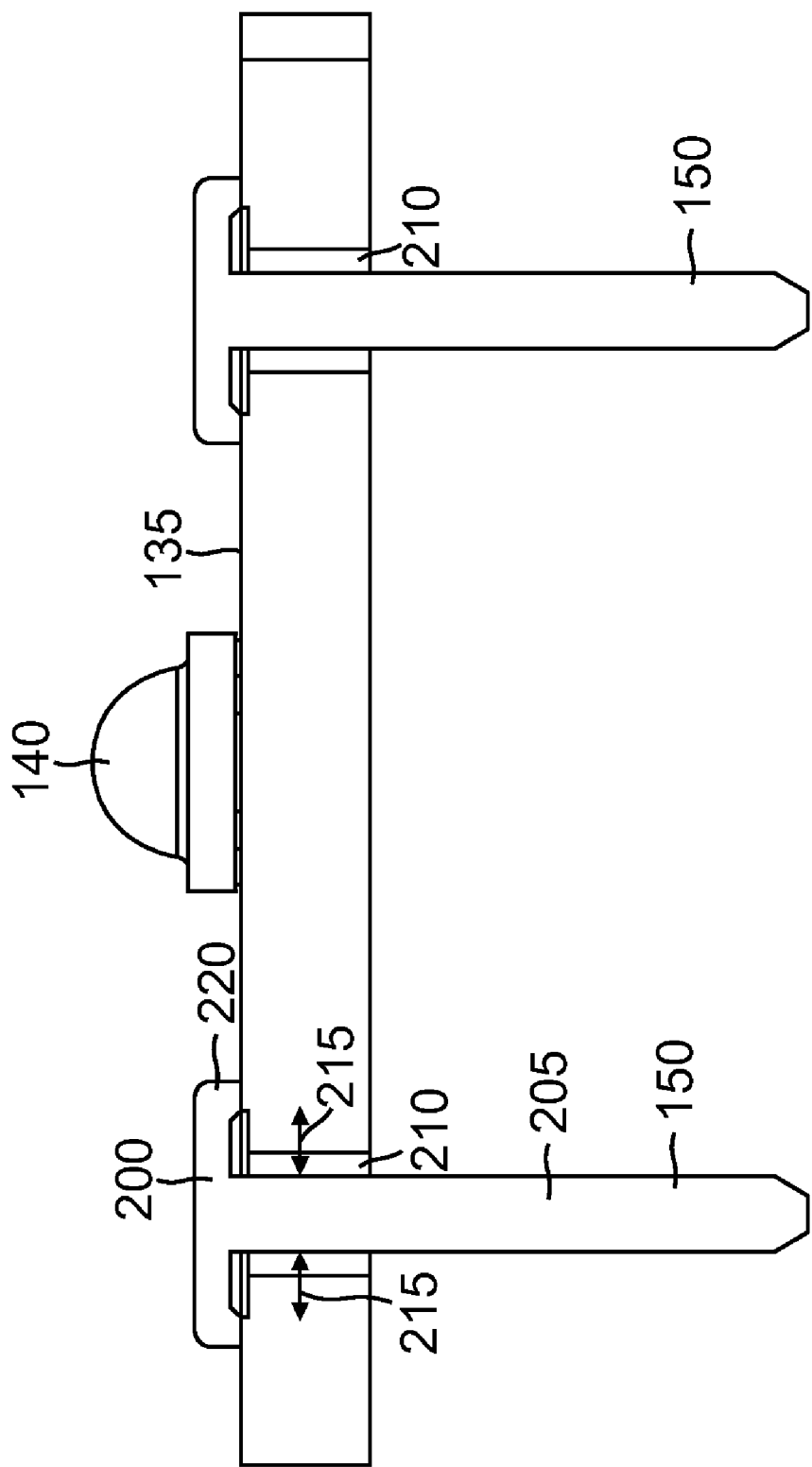
FIG. 2 is a cross-sectional view of the metal core board of FIG. 1 and the associated LED and undercut conductive pins in accordance with an embodiment of the invention.

In some embodiments, a single conductive pin 150 is sufficient in that a ground connection to LED 140 is available through an appropriate coupling through the metal core circuit board 135 to bezel 120 and from bezel 120 to battery housing 105 back to batteries 110. However, a ground connection through a second conductive pin as shown in FIG. 2 may also be provided.

Additional conductive pins may be provided as necessary for coupling control signals or other desired signals to circuits on metal core board 135. For example, FIG. 2 illustrates an embodiment in which two conductive pins 150 pass through metal core board 135. Regardless of the number of desired pins, each pin 150 has a cap 200 and a shaft or body 205. The diameter of pin shaft 205 is less than a diameter of corresponding through holes 210 in metal core circuit board 135. For example, in one embodiment pin shaft 205 has a diameter of 40 mil (one-thousandth of an inch) but through hole 210 is 65 mil in diameter. In this fashion, a clearance of approximately 12 mil circumferentially surrounds pin shaft 205 when the shaft is centered in through hole 210 such that pin 150 is electrically isolated from metal core circuit board 135.

Pin cap 200 is circumferentially undercut around pin shaft 205 such that an annular portion 215 on an underside of cap 200 is also electrically isolated from metal core board 135. To provide an electrical coupling, some portion of cap 200 connects through solder to a foil layer (discussed further with regard to FIG. 3c) on metal core board 135. Thus, an outer annulus 220 of cap 200 is not undercut to allow this electrical contact. In that regard, one pin 150 may serve as the power source for LED 140 (as coupled through an appropriate lead formed in the foil layer) whereas a remaining pin 150 acts as the ground lead for LED 140.

Figure 3A:
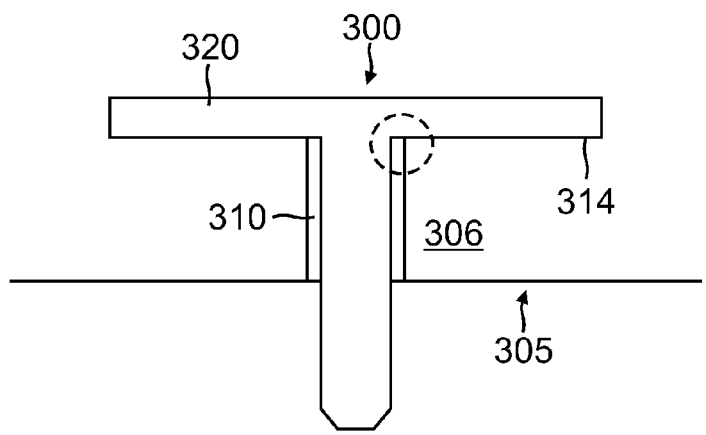
FIG. 3a is a cross-sectional view of a conductive pin transecting a metal core board without any undercutting in accordance with an embodiment of the invention.

Note the advantages of such a coupling to LED 140—no insulation layer or sleeve is necessary for through holes 210. Although an insulating sleeve is not necessary, metal core circuit board 135 can include such sleeves if desired. For example, consider FIG. 3a, which illustrates a conductive pin 300 extending though a metal core circuit board 305 and electrically isolated by a sleeve 310 (rather than just free space) without any undercutting on a lower surface 314 of a pin cap 320.

Figure 3B:
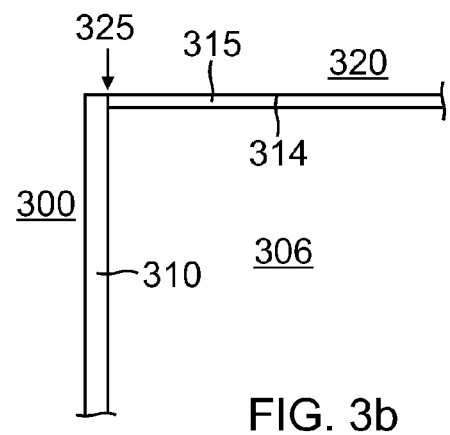
FIG. 3b is a close-up cross-sectional view of the through hole and pin junction for FIG. 3a in accordance with an embodiment of the invention.

As seen in the close-up view of FIG. 3b, undersurface 314 for a cap 320 on pin 300 is electrically isolated from a metal core 306 in board 305 by a relatively-thin dielectric coating 315. As discussed previously, such a dielectric layer isolates leads formed in a printed foil layer on metal core boards from the conducting metal core. However, due to the relative thinness of dielectric layer 315 (typically in a range of 1 to 3 mils), there is a considerable risk of shorting through to metal core 306 at an edge 325 of layer 315.

For example, there may be minor defects along edge 325 that allow metal-to-metal contact between cap 320 and metal core 306. Alternatively, the voltage between cap 320 and core 306 may cause arcing across such short distances. Thus, the mere presence of an insulating sleeve 310 does not provide adequate isolation between cap 320 and core 306 at edge 325 of dielectric layer 315 as compared to embodiments with a circumferential undercutting on the pin cap as discussed with regard to FIG. 2.

Figure 3C:
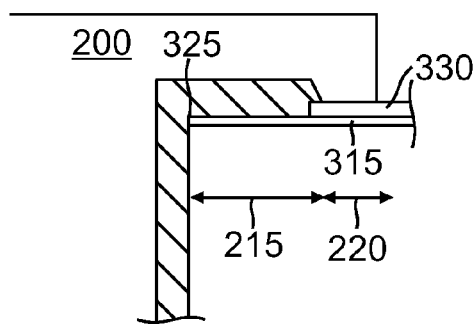
FIG. 3c is a close-up cross-sectional view of the through hole and pin junction for FIG. 2 in accordance with an embodiment of the invention.

In that regard, consider the cross-sectional view of undercut cap 200 at the junction with dielectric layer edge 325 as seen in FIG. 3c. As discussed with regard to FIG. 2, cap 200 is undercut in annular region 215 such that only an outer annular non-undercut region 220 has electrical contact with a printed foil layer 330 that overlays dielectric layer 315. Note that annular undercut region 215 for cap 200 is displaced from dielectric layer 315 by the depth of the undercutting and the thickness of foil layer 330.

In one embodiment, annular undercut region 215 is undercut to a depth of 5 mil. Foil thickness may range from 3 to 5 mil such that the cap lower surface in annular undercut region 215 is displaced from dielectric layer 315 by 8 to 10 mil in such an embodiment. In contrast, as seen in FIG. 3b, pin cap 300 without any undercutting is merely isolated from metal core 306 by the (typically 1 to 3 mil) thickness of dielectric layer 315. Accordingly, the undercutting for pin cap 200 substantially increases the robustness with regard to preventing electrical shorts between the pin and the metal core.

Figure 4:
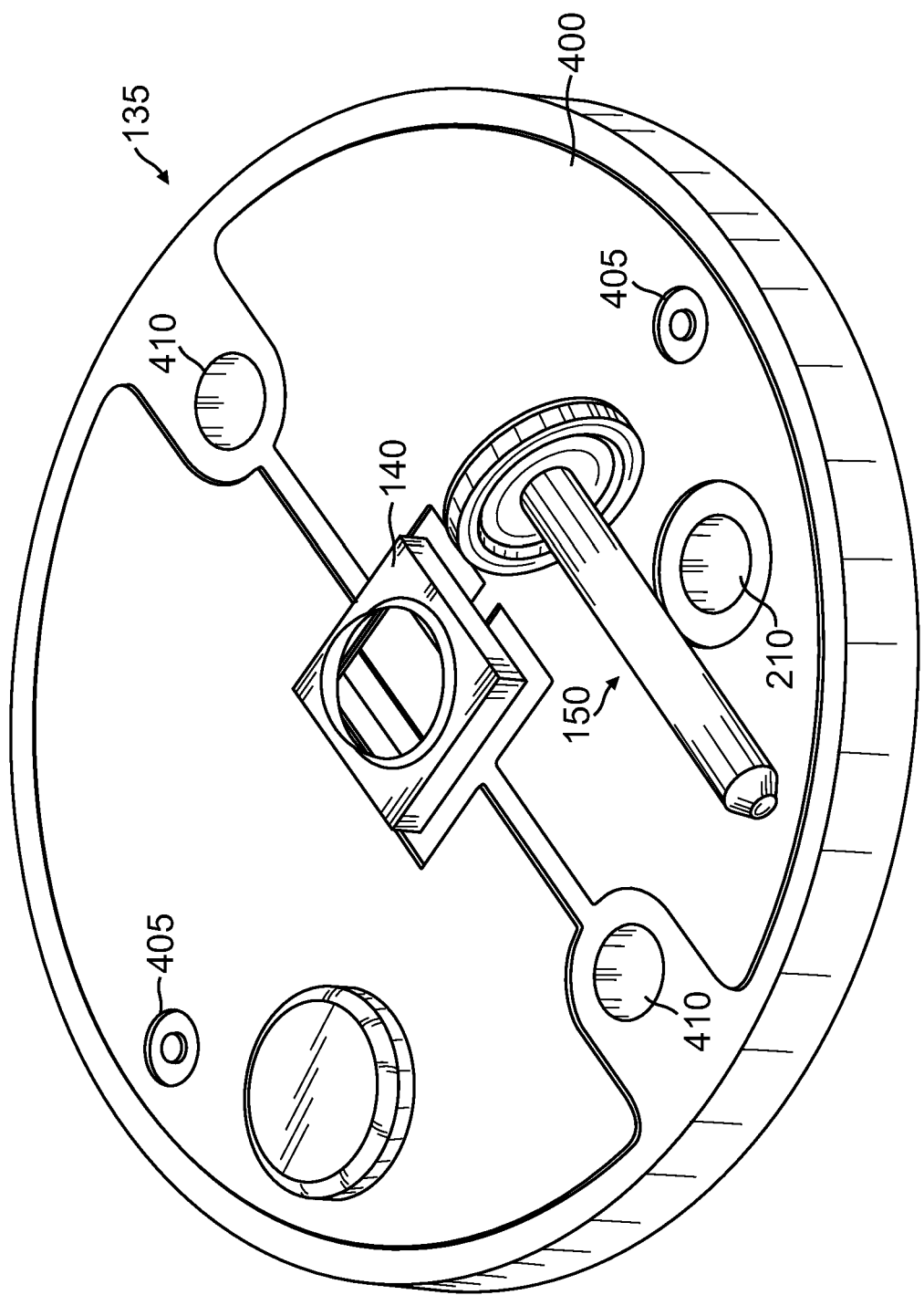
FIG. 4 is a perspective view of a metal core board and associated LED and undercut conductive pins in accordance with an embodiment of the invention.

A method for manufacturing circuit board 135 with pins 150 will now be discussed. As seen in FIG. 4, a solder mask 400 is deposited over the printed foil layer. Mask 400 has annular openings about through holes 210 so that an annular ring of solder/flux paste may be placed around through holes 210 on the foil layer to eventually solder to corresponding outer annular regions 220 of pin cap 200 discussed earlier.

Solder/flux paste is also laid down in an appropriate pattern for coupling to LED 140. The leads within printed foil layer 330 that couple from pins 150 to LED 140 are underneath solder mask 400 in FIG. 4 and are thus not visible.

The solder/flux paste will not only promote fusion but also is adhesive. Thus, when pins 150 and LED 140 are placed onto the solder/flux paste layers, these components will tend to adhere to metal core circuit board 135 before the solder is reflowed in a reflow oven. For illustration purposes, a pin 150 is left unmounted in FIG. 4.

To assist robotic placement of pins 150 into through holes 210, solder mask 400 may include one or more fiducials 405. Despite the presence of fiducials 405, there is some tolerance with regard to an exact centering of each pin in a corresponding through hole. Thus, it is desirable that the difference between the pin shaft diameter and the through hole diameter accommodate this tolerance.

For example, suppose the tolerance is plus or minus 5 mil. If one desires at least a 5 mil separation between the pin shaft and the through hole wall, the through hole diameter should be at least 20 mil greater than the pin shaft diameter to satisfy the desired separation. In general, the diameter difference between the pin shaft and the through hole will depend upon the tolerance provided by the placement method for centering the pins within each through hole upon insertion.

After the pins and LED have been placed upon the circuit board, the resulting assembly may be heated in a reflow oven such that the pins and LED are soldered to the foil layer. In that regard, note that the solder ring surrounding through holes 210 in FIG. 4 overlies a corresponding ring of metal formed in the printed foil layer. As the solder melts in the oven, surface tension will thus tend to further center each pin in its respective through hole. In this fashion, lower tolerances are accommodated with regard to an initial centering of each pin by a robot.

It will be appreciated however that although an automated assembly lowers manufacturing costs, the pins could also be placed manually in their corresponding through holes. Referring back to FIG. 1, the resulting circuit board assembly may be fastened to the bezel backing plate 130 using, for example, thermally-conductive glue. To enable convenient grasping of metal core circuit board 135 by a robotic arm during assembly, board 135 includes recesses (or through holes) 410 as shown in FIG. 4. A robotic arm can thus insert fingers into recesses 410 to move metal core circuit board 135 such as when metal core circuit board 135 is placed into a reflow oven, or when placed into the bezel during later assembly.

Referring again to FIG. 2, it may observed that to prevent electrical shorts to the metal core beneath the dielectric layer, the undercut portion 215 need merely circumferentially surround the pin shaft and have some sufficient width or lateral extent such as 35 mil. This undercut need not form a circular annulus but such a shape is naturally achieved through a rotating machining process such a lathe to form the undercut. Similarly, the pin cap need not be circular but again such a shape is convenient. Pins 150 may be constructed of a suitable conductive metal such as brass, copper, or aluminum. To aid in the establishment of electrical contact, pins 150 may be gold plated.

Embodiments described above illustrate but do not limit the invention. For example, a manufacturing method was discussed with regard to a reflow soldering process but it will be appreciated that other soldering techniques could be used to connect the pin cap to the board's printed foil layer. Thus, it should also be understood that numerous modifications and variations are possible in accordance with the principles of the present invention. Accordingly, the scope of the invention is defined only by the following claims.

We claim:

1. A circuit board assembly, comprising:
a metal core circuit board having a principal surface for mounted circuits and at least one through hole extending between the principal surface and a backside surface of the metal core circuit board; and
an at least one conductive pin, wherein each conductive pin includes a shaft extending through a corresponding through hole and a pin cap abutting the principal surface adjacent the corresponding through hole such that an undercutting for the pin cap circumferentially surrounds the corresponding through hole.

2. The circuit board assembly of claim 1, wherein a non-undercut outer annulus for each pin cap is soldered to a printed foil layer for the metal core circuit board.

3. The circuit board assembly of claim 2, further comprising a light emitting diode (LED) circuit soldered to the printed foil layer.

4. The circuit board assembly of claim 3, wherein the circuit board assembly is secured within a flashlight head.

5. The circuit board assembly of claim 4, wherein the circuit board assembly is secured through a thermally-conductive glue.

6. The circuit board assembly of claim 1, wherein the at least one conductive pin comprises two conductive pins and the at least one through hole comprises two through holes such that a first one of the through holes corresponds to a first one of the pins and a second remaining one of the through holes corresponds to a second remaining one of the pins.

7. The circuit board assembly of claim 6, wherein each shaft has a diameter smaller than a diameter for the corresponding through hole such that each shaft is electrically isolated from a metal core for the circuit board.

8. The circuit board assembly of claim 7, wherein each shaft diameter is at least 5 mil less than each through hole diameter.

9. The circuit board assembly of claim 8, wherein each shaft diameter is at least 20 mil less than each through hole diameter.

10. A method of manufacturing the circuit board assembly of claim 1, the method comprising:
providing the metal core circuit board having the at least one through hole at least partially surrounded by solder;
inserting the shaft for each conductive pin into the corresponding through hole such that the pin cap for the conductive pin abuts the solder wherein the corresponding through hole has a diameter sufficiently exceeding a diameter for the shaft such that the shaft is electrically isolated from a metal core for the metal core circuit board, and wherein the undercutting for the pin cap has an inner undercut portion surrounding the corresponding through hole and an outer remaining portion abutting the solder; and
heating the solder such that it melts and electrically couples each conductive pin to a metal foil layer on the metal core circuit board to form the circuit board assembly.

11. The method of claim 10, further comprising placing a circuit on a solder circuit pad on the metal core circuit board prior to the heating of the solder.

12. The method of claim 11, wherein the melting of the solder electrically couples the circuit to each conductive pin.

13. The method of claim 12, wherein the circuit includes a light emitting diode (LED).

14. The method of claim 11, further comprising securing the circuit board assembly to a flashlight bezel.

15. The method of claim 14, wherein the securing comprises gluing the circuit board assembly to a backing plate on the bezel with a thermally-conductive glue.

16. A flashlight comprising the circuit board assembly of claim 1, the flashlight further comprising:
a flashlight head including a lens held by a bezel, wherein the metal core circuit board is secured to the bezel and includes a light emitting diode (LED) for illumination through the lens; and
a battery housing for holding batteries for powering the LED through a conductive path that includes a first one of the conductive pins having its shaft extending through a first one of the through holes in the metal core circuit board, wherein the pin cap of the first conductive pin abuts the principal surface of the metal core circuit board adjacent the first through hole such that the undercutting for the pin cap circumferentially surrounds the first through hole.

17. The flashlight of claim 16, wherein the conductive path further includes a second one of the conductive pins having its shaft extending through a second one of the through holes in the metal core circuit board, wherein the pin cap of the second conductive pin abuts the principal surface of the metal core circuit board adjacent the second through hole such that the undercutting for the pin cap of the second conductive pin circumferentially surrounds the second through hole.

18. The flashlight of claim 17, wherein each pin cap includes a non-undercut outer annulus soldered to a printed foil layer for the metal core circuit board.

19. The flashlight of claim 17, wherein each shaft has a diameter smaller than a diameter for the corresponding through hole such that each shaft is electrically isolated from a metal core for the metal core circuit board.

20. The flashlight of claim 19, wherein the conductive path further includes a switch.

* * * * *